United States Patent [19]

Kessler

[11] 4,183,767

[45] Jan. 15, 1980

[54] LIGHT DIFFUSING OR SPECTRAL COATING FOR PRINTED CIRCUIT BOARDS AND THE LIKE

[76] Inventor: Stanley Kessler, 9317 Mary Knoll, Whittier, Calif. 90605

[21] Appl. No.: 944,190

[22] Filed: Sep. 20, 1978

Related U.S. Application Data

[63] Continuation of Ser. No. 717,497, Aug. 25, 1976, abandoned.

[51] Int. Cl.$^2$ ............................................... C08J 3/02
[52] U.S. Cl. .................................... 106/236; 106/237; 260/30.8 DS
[58] Field of Search ................... 260/30.8 DS, 607 D; 106/236, 237

[56] References Cited

U.S. PATENT DOCUMENTS

| | | | |
|---|---|---|---|
| 2,477,654 | 8/1949 | Rummelsburg | 106/236 X |
| 2,635,053 | 4/1953 | Schwartz | 106/236 |
| 2,635,053 | 4/1953 | Schwartz | 106/236 |
| 2,805,970 | 9/1957 | McBride | 106/219 X |
| 2,919,295 | 12/1959 | Storks | 260/607 D X |
| 3,023,183 | 2/1962 | Nelson | 260/30.2 |
| 3,034,930 | 5/1962 | Foudriat, Jr. | 106/237 X |

Primary Examiner—Richard B. Turer
Attorney, Agent, or Firm—Boniard I. Brown

[57] ABSTRACT

A glare-reducing coating to aid visual inspection of bright surfaces such as on printed circuit boards and assemblies, which, when applied from a liquid solution, selectively diffuses light on metal surfaces while remaining transparent over plastic substrates. The optical, tack-free coating is readily cleaned from surfaces by conventional soldering flux solvents and aqueous cleaning solutions. The tack-free, solderable coating greatly aids the visual inspection of the coated circuit board by eliminating spectral glare, and becomes transparent when heated to soldering temperature to indicate the area of rework. The coating comprises a combination of a thermoplastic rosin, suitable as a soldering flux, and DMSO in a suitable solvent, preferably consisting of or including chlorinated solvents such as methylene dichloride, thus to insure a non-flammable coating which is readily applied by dipping, brushing, or spraying.

7 Claims, No Drawings

LIGHT DIFFUSING OR SPECTRAL COATING FOR PRINTED CIRCUIT BOARDS AND THE LIKE

This is a continuation of application Ser. No. 717,497, filed Aug. 25, 1976 now abandoned.

BACKGROUND OF THE INVENTION

The invention relates to coatings for printed circuit boards and the like. It relates, more particularly, to such coatings which have the property of reducing glare and spectral reflectances from the metallic conductors on the surfaces of such boards and from the solder joints affixing electronic components to such boards.

The fabrication and use of printed circuit boards and assemblies is well-known in the electronic arts. Such boards are manufactured by several methods depending on the quantities required and the desired reliability and service life. Discrete components are attached to such boards by manual, semi-automatic, fully automatic wave-soldering, or other soldering equipment.

One of the major costs associated with the manufacture of such circuit boards and assemblies relates to the requirement for close visual inspection of the finished article for the detection of damaged conductors, cold solder joints, breaks, pinholes and other imperfections which could affect the performance of the finished assembly. Such inspection is difficult because of the glare and spectral reflections from the conductors and joints, such reflections commonly appearing as very bright metallic planes and projections. Due to such reflections it is fatiguing to perform such inspections and difficult to assess variations in perceived brightness as to whether they emanate from actual breaks or faults, or represent purely optical phenomena arising from the interaction of the sculptured, mirror-like surfaces and the incident light.

Coating of such circuit boards has been known in the art, and has been undertaken for a plurality of purposes. One such purpose is sealing of the surface against moisture penetration into the substrate and into the interfaces between the substrate and the conductors. One such coating has been disclosed in U.S. Pat. No. 3,034,930 to Foudriat. Another coating is disclosed in U.S. Pat. No. 3,406,285 to Scorgie, et al., wherein the coating is applied prior to a manual soldering operation and contains a fluorescent dye the properties of which change at the proper fusing temperature for the solder used, so that subsequent inspection under ultraviolet illumination can pinpoint joints which have not attained the desired temperature during soldering.

None of the coatings of the prior art are of any actual benefit in performing visual inspections and none eliminate the requirement for such inspection.

It is, therefore, the primary object of the invention to teach the compounding, application and use of a coating which, when applied to a printed circuit board or assembly, will assist in detecting faulty soldering and defective printed conductors.

It is an object of the invention to teach the use of materials in such a coating which permit the performance of rework by common soldering methods after a fault has been detected.

It is another object of the invention to teach light diffusing coatings having the above properties, which may be safely applied by brushing, spraying or other methods, which are non-toxic and non-flammable as applied, and which may be removed with solvents, solutions, and systems normally used for rosin flux.

It is an additional object of the invention to teach the preparation and use of a light diffusing coating which will, by a change in its reflectance, mark the site of rework and, thereby, facilitate subsequent inspection procedures.

It is a further object of the invention to teach the compounding of light diffusing coatings for printed circuit boards and assemblies which make use of commonly available materials and blending processes, are economical to procure, are easy to apply, and have inherent properties conducive to long shelf-life both as raw material and after coating.

SUMMARY OF THE INVENTION

The invention attains the foregoing objects, and other objects and advantages which shall become apparent from the description of the preferred embodiments thereof, by providing a low-viscosity fluid incorporating a rosin, typically having a relatively high-melting point, and dimethyl sulfoxide dissolved in suitable solvents.

After the evaporation of the solvents from the above combination a stable coating is formed over the printed circuit board coated therewith, having the property of optical transparency where the underlying material is a non-conductor, such as the plastic composition substrate of the circuit board, and of being translucent, light-scattering, where the substrate is a metal conductor. Consequently, the viewing of the circuit board is greatly facilitated, with the metal-covered portions clearly demarcated from the underlying circuit board, and with the reflections from the bright metallic surfaces suppressed by the scattering of light waves in the coating.

It is a particular feature of common faults in printed circuit boards and assemblies that the bright, contoured surfaces reflect light in such a manner that an apparition hole or break appears to exist, this illusion being of light not reaching the viewer's eyes from that particular spot. The viewer must change the relative position of the eyes and the viewed surface in order to confirm that a fault does or does not exist, thus requiring the viewing of each contoured surface from at least two positions. Such spectral reflectances are eliminated by the coating of this invention, with the results that the contoured surface of a fault is seen in its true nature and perspective from a single viewing position, and that the detection of breaks in circuitry is greatly facilitated and enhanced by the contrast between the transparency of the coating on the plastic substrate and the light scattering of the coating above metal conductors.

Thus, the substantial reduction of glare and elimination of spectral reflectances from the circuit board provides substantial advantages greatly improving the quality and speed of the inspection process, by enabling the positive and immediate distinction of a defect from a spectral defect requiring confirmation from a different viewpoint, and by reducing inspector eye fatigue. It is common inspection practice to require assessment of the defect so that faults with specific attributes may be permitted. This judgmental factor consumes substantial inspector time and involves management time to act as referee. Elimination of the spectral or ghost reflections by the coating of this invention, allows more rapid and discerning evaluation of the attributes of the defects, thus eliminating much of the costs involved in the referee function of management which is, necessarily, reflected in the cost of manufacture.

The inclusion of dimethyl sulfoxide in the coating provides the desired optical properties. The chemical properties of this material are also of benefit in permitting a wide range of solvents to be employed, because it acts as a coupling agent, as well as a partial solvent for the rosin itself. Because of the capacity of the dimethyl sulfoxide to support combustion, it is desirable to employ a chlorinated solvent in conjunction with it. Mixtures in which the weight of the chlorinated solvent approximately equals that of the dimethyl sulfoxide become non-flammable, and can be dispensed from aerosol cans or other spray apparatus which would otherwise render the coating highly inflammable due to the fine dispersion in the atmosphere.

A high melting-point rosin is desirable for the production of a hard, non-tacky coating. Rosins based on dimeric acids, such as that marketed by Hercules Powder Co. under the tradename 'Dymerex', are suitable. Rosins of similar chemical and physical characteristics may be substituted for 'Dymerex' in the various specific compositions herein described.

The coating of the invention is also non-toxic in nature so that its use does not entail any particular requirements in the manufacturing process, beyond those normally associated with the use of highly volatile solvents.

If desired, colorants, such as dyes and pigments, may be added to the coating for certain optical effects without affecting its basic attributes. The addition of minor quantities of an odorant or deodorant may be desirable where the coating produces an offensive or disturbing smell.

DESCRIPTION OF THE PREFERRED EMBODIMENT

EXAMPLE I

As previously described, methylene dichloride provides a suitable chlorinated solvent for the dispersion of the active components of the coating. A preferred composition includes one part of each of 'Dymerex' rosin and of Dimethyl sulfoxide, dissolved in eight parts, by weight, of methylene dichloride.

The composition range within which the coating exhibits the desired characteristics is set forth in Table I below:

TABLE I

| COMPONENT: | RANGE (parts by weight) | PREFERRED |
|---|---|---|
| Dimethyl sulfoxide | 1.0 | 1.0 |
| 'Dymerex' rosin | 0.5–7.0 | 1.0 |
| Methylene dichloride | 2.5 to 100 | 8.0 |

EXAMPLE II

For certain purposes it might be found more economical or advantageous to employ a blended chlorinated solvent in the light diffusing coating. Solvents such as 1,1,1 Trichloroethane or Trichlorethylene may be substituted for part of the Methylene dichloride in the composition of Example I, with substantially the same range of compositions. The preferred combination of such components comprises one part of each of 'Dymerex' rosin and Dimethyl sulfoxide, dispersed in six parts of a solvent comprising a blend of four parts of weight of 1,1,1 Trichloroethane and two parts by weight of Methylene dichloride.

EXAMPLE III

Although chlorinated solvents are the most satisfactory with respect to the desired characteristic of flame resistance, it is possible to substitute for them, or for a certain proportion of them, conventional solvents such as acetone, methyl ethyl ketone, xylene, toluene, fluorocarbons, and alcohols in general.

One particularly suitable formulation which retains a non-flammable character comprises the active ingredients and solvents in the general range given in Example I, with a preferred composition including one part by weight of 'Dymerex' rosin, one part by weight of Dimethyl sulfoxide, two parts by weight of Isopropyl alcohol (99% concentration), and six parts by weight of Methylene dichloride.

It is to be understood that the invention has been disclosed with reference to three particular combinations of the active ingredients, a high-melting point rosin and Dimethyl sulfoxide, and solvents. Other formulations are possible and practicable and may be preferred by those skilled in the art for particular applications. One criterion for the choice of solvent, for example, may reside in the tolerance or sensitivity of the substrate to particular chemical species.

Furthermore, the addition of odorant and colorant agents in reasonable proportions may be desired in certain applications.

The combinations disclosed above have the advantage of indicating the location of a repaired conductor by a change in the optical transparency of the coating. The coating material serves as a flux for a solder joint repair and, after the application of the required elevated temperature, becomes optically transparent, facilitating identification of the repaired joint during secondary inspection.

A particular safety feature associated with the compositions described above is their retention of non-flammability in the viscosity range suitable for application by brush or spraying. The loss of the more volatile solvent components may so increase the relative proportion of the combustible substance Dimethyl sulfoxide that the coating mix may itself become susceptible to ignition. The viscosity at this concentration will, however, be so high that effective application becomes impossible, until additional solvent is intermixed with the residue.

Removal of the light diffusing coating, as in preparation for delivery or for application of other specific coatings, can be accomplished by use of any of the aforementioned solvents or by use of certain aqueous cleaning solutions used in the industry.

The invention herein is not limited to the actual compositions described in detail herein, but is delimited only by the appended claims.

The inventor claims:

1. A composition of matter suitable for application as an optical coating to the surfaces of printed circuit boards and assemblies, comprising:
   a high-melting point rosin,
   dimethyl sulfoxide, the weight of the rosin being at least one-half the weight of the dimethyl sulfoxide, and
   a solvent carrier.

2. A composition of matter according to claim 1, wherein:

said high-melting point rosin is substantially composed of dimeric acids, and said solvent includes chlorinated solvents.

3. A composition according to claim 1, wherein: the rosin comprises from one-half to seven times the weight of the dimethyl sulfoxide, and the solvent is two and one-half to 100 times the weight of the dimethyl sulfoxide.

4. A composition according to claim 3, wherein: the rosin and the dimethyl sulfoxide are of equal weight and the solvent is eight times the weight of either of these components.

5. A composition according to claim 4, wherein: said solvent is methylene dichloride.

6. A composition according to claim 3, wherein said solvent is a combination of chlorinated and non-chlorinated solvents selected from the group of:

methylene dichloride,
1,1,1 trichloroethane,
trichloroethylene,
acetone,
isopropyl alcohol,
ethyl alcohol,
methyl alcohol,
methyl ethyl ketone,
xylene,
toluene, and
a fluorocarbon solvent.

7. A composition according to claim 1, wherein: the rosin comprises from one-half to seven times the weight of the dimethyl sulfoxide, and the solvent is two and one-half to seventeen times the weight of the dimethyl sulfoxide.

* * * * *